(12) United States Patent
Erdogan

(10) Patent No.: US 8,451,042 B2
(45) Date of Patent: May 28, 2013

(54) APPARATUS AND SYSTEM OF IMPLEMENTATION OF DIGITAL PHASE INTERPOLATOR WITH IMPROVED LINEARITY

(75) Inventor: Mustafa Ulvi Erdogan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 188 days.

(21) Appl. No.: 13/153,190

(22) Filed: Jun. 3, 2011

(65) Prior Publication Data

US 2012/0306552 A1    Dec. 6, 2012

(51) Int. Cl.
*H03H 11/16*    (2006.01)

(52) U.S. Cl.
USPC .......................................... 327/231; 327/149

(58) Field of Classification Search
None
See application file for complete search history.

(56) References Cited

U.S. PATENT DOCUMENTS

| | | | |
|---|---|---|---|
| 5,945,862 A | 8/1999 | Donnelly et al. | |
| 6,114,914 A | 9/2000 | Mar | |
| 6,236,703 B1 | 5/2001 | Riley | |
| 6,617,909 B2 | 9/2003 | Shim | |
| 7,295,077 B2 | 11/2007 | Thomsen et al. | |
| 7,417,510 B2 | 8/2008 | Huang | |
| 7,596,670 B2 | 9/2009 | Zohar et al. | |
| 7,764,134 B2 | 7/2010 | Fu et al. | |
| 8,258,839 B2 * | 9/2012 | Erdogan | 327/158 |
| 2005/0093594 A1 | 5/2005 | Kim et al. | |

OTHER PUBLICATIONS

Yang, Ching-Yuan, et al.; "A High-Frequency Phase-Compensation Fractional-N Frequency Synthesizer"; 2005 IEEE, pp. 5091-5094.
Garlepp, Bruno W., et al., "A Portable Digital DLL for High-Speed CMOS Interface Circuits"; IEEE Journal of Solid-State Circuits, vol. 34, No. 5, May 1999, pp. 632-644.
Garlepp, Bruno W., et al., "A Portable Digital DLL for High-Speed CMOS Interface Circuits"; 1998 Symposium on VLSI Circuits Digest of Technical Papers, 1998, pp. 214-215.
Saeki, Takanori, et al., A 1.3-Cycle Lock Time, Non-PLL/DLL Clock Multiplier Based on Direct Clock Cycle Interpolation for "Clock on Demand", IEEE Journal of Solid-State Circuits, vol. 35, No. 11, Nov. 2000, pp. 1581-1590.
Chang, Hsiang-Hui, et al., "A 0.7-2 GHz Self-Calibrated Multiphase Delay-Locked Loop", IEEE Journal of Solid-State Circuits, vol. 41, No. 5, May 2006, pp. 1051-1061.

* cited by examiner

*Primary Examiner* — Cassandra Cox
(74) *Attorney, Agent, or Firm* — Alan A. R. Cooper; Wade J. Brady, III; Frederick J. Telecky, Jr.

(57) ABSTRACT

An apparatus comprising: a first control switch driven by a first bit value; a first weighted switch driven by a first clock signal; a first intermediate node coupled between the first control switch and the second weighted switch; a first precharge transistor coupled to the first intermediate node, wherein the precharge transistor is driven by an inverse of the clock signal; a second control switch driven by an inverse of the bit; a second weighted switch driven by a second clock signal; a second intermediate node coupled between the second control switch and the second weighted switch; a second precharge transistor coupled to the second intermediate node, wherein the second precharge transistor is driven by an inverse of the second clock signal; and a capacitor coupled to the first control switch, the second control switch, the first precharge transistor and the second precharge transistor.

20 Claims, 4 Drawing Sheets

APPARATUS AND SYSTEM OF IMPLEMENTATION OF DIGITAL PHASE INTERPOLATOR WITH IMPROVED LINEARITY

TECHNICAL FIELD

This application is directed, in general, to a digital phase interpolator and, more specifically, to a digital phase interpolator with an improved linear response.

BACKGROUND

Phase locked loops (PLLs) have been used for frequency synthesis in many conventional circuits, and these PLLs generally included internal and/or external dividers. These PLLs (and the corresponding dividers) have also been used to generate fractional frequencies, but, usually, at a price (namely, spurs and jitter). Therefore, there is a need for an improved fractional divider that can be used with or within a PLL or reference clock generator. There is also a need for an improved digital phase interpolator with improved linearity to be used in design of such fractional dividers and other circuits where intermediate finer phase steps need to be derived from the available clock phases.

Some examples of conventional circuits are: U.S. Pat. No. 6,617,909; U.S. Pub. No. 2005/0093594; U.S. Pat. Nos. 5,945,862; 6,114,914; 6,236,703; 7,295,077; 7,417,510; 7,596,670; and No. 7,764,134; Yang et al, "A High-Frequency Phase-Compensation Fractional N-Frequency Synthesizer," IEEE International Symposium of Circuits and Systems", 2005 ISCAS, May 23-26, 2005, pp. 5091-5094; Garlepp et al., "A Portable Digital DLL for High-Speed CMOS Interface Circuits", IEEE Journal of Solid-State Circuits, Vol. 34, No. 5, May 1999, pp. 632-644; Garlepp et al., "A Portable Digital DLL Architecture for CMOS Interface Circuits", IEEE 1998 Symposium on VLSI Circuits Digest of Technical papers, pages 214-215; Saeki, et al., "A 1.3-Cycle Lock Time, Non-PLL/DLL Clock Multiplier Based on Direct Clock Cycle Interpolation for 'Clock on Demand'"; IEEE Journal of Solid-State Circuits, Vol. 35, November 200, pp. 1581-1590; and Chang et al., "A 0.7-2-GHz Self-Calibrated Multiphase Delay-Locked Loop", IEEE Journal of Solid State Circuits, Vol. 41, No. 5, May 2006, pp. 1051-1061.

SUMMARY

A first aspect provides an apparatus comprising: a control switch driven by a bit value; a weighted switch driven by a clock signal; an intermediate node coupled between the control switch and the weighted switch; and a precharge transistor coupled to the intermediate node, wherein the precharge transistor is driven by an inverse of the clock signal.

The first aspect further provides wherein the control switch and the weighted switch are coupled to a capacitor. A circuit precharge transistor is coupled to the capacitor that can precharge the capacitor. The precharge transistor is transitioned on when the control switch and the weighted switch are driven off.

The first aspect still further provides: a second control switch driven by an inverted bit value; a second weighted switch driven by a second clock signal; a second intermediate node coupled between the second control switch and the second weighted switch; and a second precharge transistor coupled to the intermediate node, wherein the precharge transistor is driven by an inverse of the second clock signal, wherein the first weighted switch has substantially a same capacitance as the second weighted switch. The capacitor is coupled to an inverter to generate a blended phase output of the first clock signal and the second clock signal. The bit value is part of a control word.

A second aspect provides an apparatus comprising: a first control switch driven by a first bit value; a first weighted switch driven by a first clock signal; a first intermediate node coupled between the first control switch and the second weighted switch; a first precharge transistor coupled to the first intermediate node, wherein the precharge transistor is driven by an inverse of the clock signal; a second control switch driven by an inverse of the bit of the logical unit; a second weighted switch driven by a second clock signal; a second intermediate node coupled between the second control switch and the second weighted switch; a second precharge transistor coupled to the second intermediate node, wherein the second precharge transistor is driven by an inverse of the second clock signal; and a capacitor coupled to the first control switch, the second control switch, the first precharge transistor and the second precharge transistor.

The second aspect further provides a circuit precharge transistor coupled to the capacitor that can precharge the capacitor. The precharge transistor is transitioned upon the control switch and the weighted switch both being driven off. The capacitor is coupled to an inverter to generate a blended phase output of the first clock signal and the second clock signal. The first bit value is part of a control word.

A third aspect provides a system, comprising: a delay locked loop (DLL) having a plurality of taps; a phase blender that is coupled to receive signals from consecutive taps of the DLL, the phase blender, including: a control switch driven by a bit value; a weighted switch driven by a clock signal; an intermediate node coupled between the control switch and the weighted switch; and a precharge transistor coupled to the intermediate node, wherein the precharge transistor is driven by an inverse of the clock signal, a state machine that is coupled to the phase blender so as to provide control word to the phase blender; a toggle circuit that is coupled to the phase blender and the state machine; a duty cycle correction circuit that is coupled to the toggle circuit; and a sigma delta modulator that is coupled to the toggle circuit and state machine.

The third aspect further provides wherein the control switch and the weighted switch are coupled to a capacitor. A circuit precharge transistor coupled to the capacitor that can precharge the capacitor. The precharge transistor is transitioned on when the control switch and the weighted switch are driven off.

The third aspect still further provides: a second control switch driven by a second bit value; a second weighted switch driven by a second clock signal; a second intermediate node coupled between the second control switch and the second weighted switch; and a second precharge transistor coupled to the intermediate node, wherein the precharge transistor is driven by an inverse of the second clock signal, wherein the first weighted switch has substantially a same capacitance as the second weighted switch. The capacitor is coupled to an inverter to generate a blended phase output of the first clock signal and the second clock signal. The bit value is part of a control word.

BRIEF DESCRIPTION OF THE DRAWINGS

Reference is now made to the following descriptions taken in conjunction with the accompanying drawings, in which.

DETAILED DESCRIPTION

Figure 1:
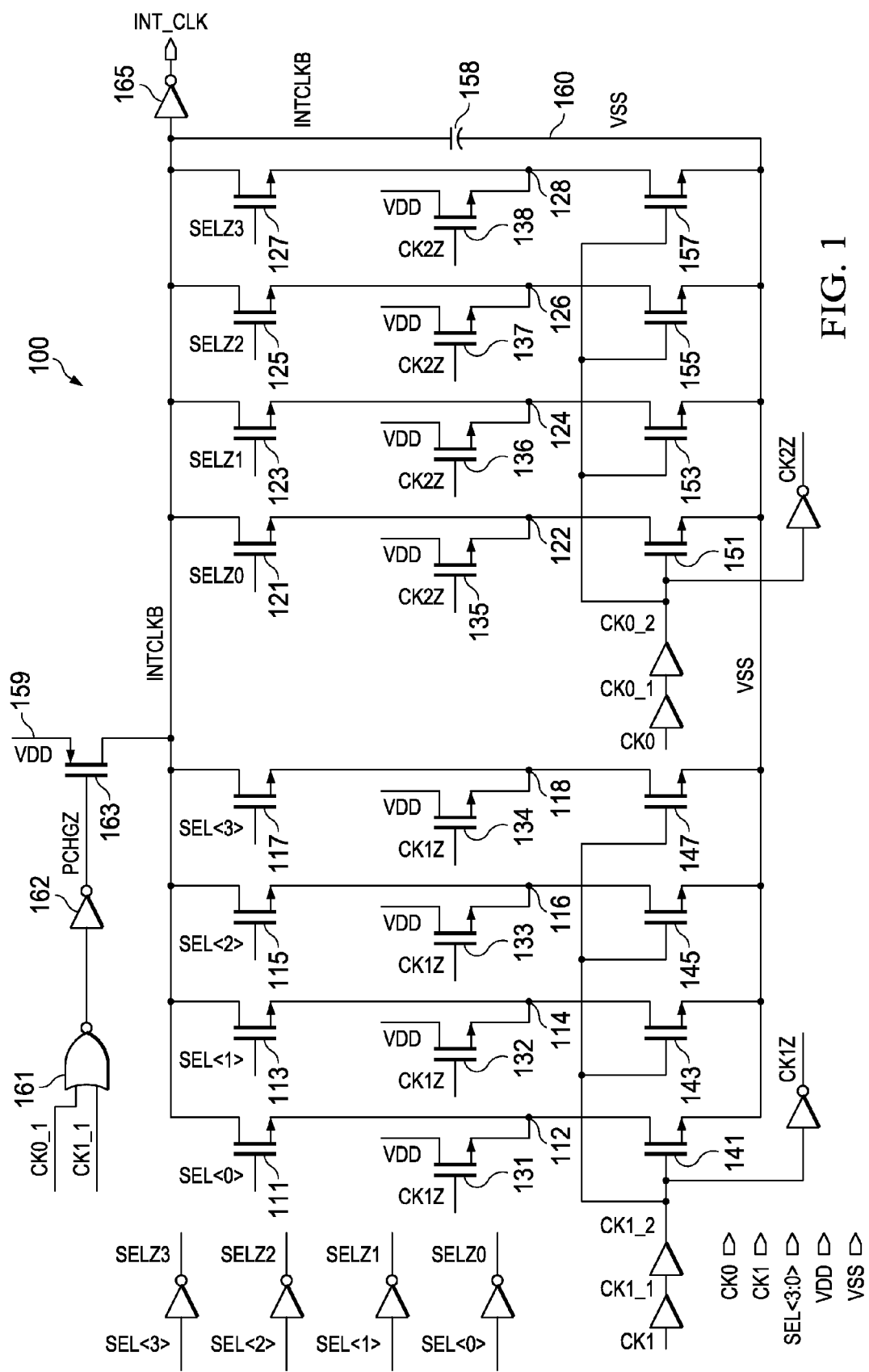
FIG. 1 illustrates an embodiment of a phase blender circuit employing pre-charge transistors coupled to their respective intermediate nodes.

Turning to FIG. 1, illustrated is a phase blender, a digital phase interpolator ("interpolator") 100. Generally, an important parameter for the interpolator 100 is its linearity, i.e., how close to an ideal desired phase a blended output clock signal, such as an INT_CLK, signal, is during an operation of the interpolator 100.

The interpolator 100 employs a plurality of nMOS transistor switches ("control switches") 111, 113, 115, 117, and control switches 121, 123, 125, 127, which are controlled by a control word: "SEL" and "SELZ" (i.e. an inverted SEL), respectively. A plurality of binary weighted clock nMOS transistor switches ("weighted switches") 141, 143, 145, 147 and weighted switches 151, 153, 155 and 157 are controlled by clock inputs: CK0 and CK1, respectively, wherein the weighted switches 141-157 are coupled in series with the control switches 111-127.

A plurality of nMOS intermediate node precharge transistors ("intermediate node precharge transistor") 131-134 and a plurality of intermediate node precharge transistors 135-138 are each, individually, coupled to each own's respective intermediate node 112-118 and intermediate node 122-128. In other words, the intermediate nodes 112-118 are coupled between its corresponding control switch 111-127 and its weighted switch 141-157, to precharge these intermediate node 112-118 and intermediate node 122-128. In one embodiment, this precharge is one threshold voltage below a voltage supply VDD 159, as shall be explained in more detail below.

A capacitor C0 160 is also provided at an output intermediate node, INTCLKB 158. The capacitor C0 160 is precharged in a low cycle of the clock inputs CK0 and CK1 by a pMOS precharge transistor ("circuit precharge transistor") 163 that is coupled to the voltage supply VDD 159.

In the interpolator 100, the gate of the circuit precharge transistor 163 is controlled by an OR of the two clock phases, CK0 and CK1. Once both these clocks CK0 and CK1 go low, the circuit precharge transistor 163 is closed and pulls up INTCKB high, before the next rising edges of CLK0 and CK1 arrive. In other words, once both CK0 and CK1 are low, Vdd voltage of the voltage supply VDD 159 of the circuit precharge transistor 163 is applied across C0 160. In one embodiment, the OR is embodied as an output of a NOR gate 161 coupled to an input of an inverter 162.

The interpolator 100, takes as inputs: two clocks signals, such as CK0 and CK1, and a control word, such as "SEL" (and its logical inverse "SELZ"), and then produces a blended phase output clock signal INT_CLK, wherein the phase of INT_CLK is a linear function of the control words. Generally, the interpolator 100 may used in various aspects where intermediate phases of a clock signal are needed. An example where a phase interpolator may be used is a fractional divider circuit "A 1 TO $2^N-1$ FRACTIONAL DIVIDER CIRCUIT WITH FINE FRACTIONAL RESOLUTION," Ser. No. 12/905,594, filed on Oct. 15, 2010, to Erdogan, which is hereby incorporated herein by reference in its entirety.

In conventional technologies, voltages at intermediate nodes in the pull-down path between two nMOS transistors in a conventional phase blender circuit can disadvantageously depend on and be affected by the control word. This can be due to a presence of parasitic capacitances (both transistor parasitics and layout parasitics) at internal nodes and capacitive coupling from the switching clock signals.

In conventional technologies, parasitic capacitances can be substantially non-interferingly discharged to ground if the control signal applied to a word switch is high, as there would be a complete path from an output capacitor to ground when the corresponding clock also goes high. In other words, if the clocked switch for a given weighted branch is on and the word switch is on, then there is a short in the line, and the parasitic capacitances at the internal node are discharged.

However, in conventional technologies, internal nodes are first charged to a voltage above zero due to parasitic coupling from the rising edge of an input clock, and then are discharged through the intended ON path if the control signal is low, as the pull-down path is incomplete. In a conventional system where clock transistors may be arranged on top and control switches may be arranged in series with them at the bottom, when the clock input transitions high, the transistors enabled by the clock input transitions are turned on. In a segment where the clock transistor on top is turned on, but the control switch transistor below is off due to the particular control word value, the node between them is therefore, disadvantageously, floating.

In conventional technologies, when a clock transitions high, this places a finite amount of charge on this node due to capacitive coupling between the clock transistor's gate and the prior art floating internal node. Since the control transistor at the bottom is off, this charge cannot be discharged to ground through this control transistor. However, the clock transistor on top is, nevertheless, on, and there is a path to ground through at least one or more nMOS pull-down segments. This path to ground is from the internal node through the clock transistor which is coupled to ground. Consequently, the charge on the internal node is removed through this path. However, since the amount of charge present on the internal nodes on clock going high, in addition to the intentional charge stored at an intermediate pull down node, which is also now in electrical series to a capacitor, is now dependent on a control word and the previous voltage on the internal node, the output phase therefore becomes non-linear.

This can be because, in conventional technologies, there is still an internal capacitance and charge on the unselected internal nodes. The amount of this charge depends on the control word SEL. The internal capacitance, and the charge upon it, affects the effective weight that is given by a given weighted branch. Consequently, the output phase does not bear a linear relation to the control word SEL as desired. This results in increased jitter.

Some of the worst deviations occur on boundaries, i.e. when switching from control 0 to 15 or vice versa. As a result, a conventional phase blender circuit can exhibits a memory effect which introduces a dependence of the phase interpolator output phase, not only on the current control word but also on the previous control word. When used in a block such as the fractional divider exemplified in "A 1 TO $2^N-1$ FRACTIONAL DIVIDER CIRCUIT WITH FINE FRACTIONAL RESOLUTION," this introduces additional jitter, i.e. non-ideal placement of clock edges in time.

Advantageously, through employment of precharge transistors 131-134, and 135-138 the voltages at the intermediate nodes 112-118 and 122-128 in the pull-down path between the control switch 111-117 and weighted switch 141-147; and control switch 121-127 and weighted switch 151-157, respectively do not depend on the previous control word, unlike conventional technologies. In one embodiment, these intermediate nodes 112-118 and 122-128 are precharged to one threshold voltage of the precharge transistors 131-138 below the voltage supply 159. In one embodiment, the gates of these precharge transistors 131-138 are controlled by the inverted clock inputs CK0Z and CK1Z.

In one embodiment of the interpolator 100, a plurality of delayed clock signals, CK0_1 and CK1_1, which are employed to control gates of the weighted switches 141-157, are also delayed relative to CK0_2 and CK1_2. CK0_2 and CK1_2 used to control the gate of the circuit precharge transistor 163. This is done to avoid any contention between the precharge path of the capacitor 160 and pull-down paths (i.e. a pull down path is when both the control switch 111-127 and its weighted switch 141-157 is on).

In a conventional interpolator, if a pMOS precharge transistor is on and conducting when a pull-down path is on, a simultaneous pull-up path provided by a pMOS capacitor precharge transistor, when conducting, would fight a discharge of a prior art intermediate node. In a conventional circuit, the pull-up path may be a pMOS transistor whose gate is always connected to ground. Consequently, the pull-up path is always on. In this case, the discharge time of an intermediate node is not entirely controlled by the pull-down path, and therefore would not be entirely controlled by the digital control word. This is undesirable as it would make the final output phase of the prior art interpolator not directly proportional to the control word input, and non-linear.

In one embodiment of the interpolator 100, this undesirability is avoided by activating the circuit precharge transistor 163 only after the input clocks CK0_1 and CK1_1 both transition to a low state, at which time the pull-down path is already off.

In one embodiment, control words SEL and SELZ are set up and ready prior to the rising edge of the clock inputs, and are applied to control switches 111-117 and 121-127, respectively. Once the rising edges of CK0 and CK1 arrive at weighted switches 141-147, the control word SEL controls the relative contributions of the early (CK0) and late (CK1) clock inputs to the timing of the discharge of the capacitor C0 160.

In one embodiment, control words SEL and SELZ are set up and ready prior to the rising edge of the clock inputs, and are applied to control switches 111-117 and 121-127, respectively. Once the rising edges of CK0 and CK1 arrive at weighted switches 141-147, the control word SEL controls the relative contributions of the early (CK0) and late (CK1) clock inputs to the timing of the discharge of the capacitor C0 160.

In the circuit 100, when the inverted input clocks CK0Z and CK1Z go low, the interpolation of the rising edge between the CK0 and CK1 clock signals is complete. There is now an open circuit through weighted switches 141-147 and 151-157. However, the inverted clocks CK0Z and CK1Z go high, substantially simultaneously as the inverted input clocks CK0Z and CK1Z go low, allowing the precharging of the intermediate nodes 112-118 and intermediate nodes 122-128 all to the same voltage, regardless of any previously given control word or magnitude of parasitic capacitances at these intermediate nodes. Then, when the clock signals CK0 and CK1 go high, CK0Z and CK1Z go low and turn off the precharge transistors 131-138, allowing the interpolation to take place based on a present control word input and the same internal charge state regardless of the control word.

In one embodiment, clocks signals are coupled to weighted switches 141-147 and 151-57, which are placed at the bottom of an nMOS stack of the interpolator 100, and the control switches 111-117 and 121-127 are placed at the top. This is done so that there is no short circuit current due to its corresponding precharge transistor 131-138 and the bottom nMOS transistor weighted switches 141-157 being on at a same time. In one embodiment, some of the control switches 111-117 are on and some are off depending on the control word, such as SEL, and control switches 121-127 are on an off depending upon an inverted control word, such as SELZ.

In the interpolator 100, precharge transistors 131-138 are on during low clock phase, half the time. Hypothetically, if control switches were placed on the bottom of a discharge path, the ones that are on for that particular control word would provide a complete short-circuit path from supply to ground in series with precharge transistors whenever the precharge transistors are high and these precharge transistors are also on. However, in order to avoid this hypothetical short circuit path, weighted switches 141-157 are placed on the bottom of a conductive path, and precharge transistors 131-138 are controlled by an inverse of a clock signal that drives weighted switches 141-157.

In one embodiment, in the interpolator 100, weighted switches 141-157 are sized in direct proportion to a binary control bit of its corresponding control switch 111-127, e.g. if the width of weighted switch 141 is one unit, weighted switch 143 is sized to have a width of 2 units, weighted switch 145 is sized to have width of 4 units, and weighted switch 147 is sized to have a width of 8 units. Weighted switches 151-157 are sized the same way proportional to their control bit. This allows digital control of the strength of the overall pull-down path consisting of nMOS transistors that are the weighted switches 141-157. Generally, weighted switches 141-157 have a capacitance in proportion to its individual size. This in turn allows for digital control of the discharge time of node 158, which in turn controls output timing. In one embodiment, for uniformity, gate length of transistors weighted switches 141-157 are kept the same and their width is adjusted in proportion to their corresponding binary position they represent in the control word.

In the following description, particular elements are numbered for ease of explanation. However, please note that other appropriate numbered elements of a numbered set may be used. In one embodiment, a control switch, such as control switch 111, is driven by a bit value, and a weighted switch, such as weighted switch 131, is driven by a clock signal. An intermediate node, such as intermediate node 112, is coupled between the control switch 111 and the weighted switch 141. A precharge transistor, such as precharge transistor 131, is coupled to the intermediate node 112, wherein the precharge transistor 131 is driven by an inverse of the clock signal. The control switch 111 and the weighted switch 141 are coupled to the capacitor 158. The capacitor precharge transistor 163 is coupled to the capacitor 158 that can precharge the capacitor 158. The precharge transistor 131 is transitioned on when the control switch 111 and the weighted switch 141 are driven off.

In a further embodiment, the circuit 100 further includes a second control switch, such as control switch driven by an inverted bit value; a second weighted switch, such as weighted switch 151, driven by a second clock signal; a second intermediate node, such as intermediate node 122, coupled between the second control switch 121 and the second weighted switch 151; and a second precharge transistor, such as precharge transistor 135, coupled to the intermediate node 122, wherein the precharge transistor 136 is driven by an inverse of the second clock signal. The first weighted switch 141 has substantially a same capacitance as the second weighted switch 151. The capacitor 158 is coupled to the first control switch 141, the second control switch 151, the first precharge transistor 131 and the second precharge transistor 151. The capacitor 158 is coupled to the inverter 165 to generate a blended phase output of the first clock signal and the second clock signal. The bit value is part of a control word.

In a yet further embodiment, a third control switch, such as control switch 113, is driven by a second bit value. A third weighted switch, such as weighted switch 143 is driven by the clock signal. A third intermediate node, such as node 114, is coupled between the third control switch 113 and the third weighted switch 143. A third precharge transistor, such as precharge transistor 132, is coupled to the third intermediate node 114, wherein the third precharge transistor 132 is driven by an inverse of the clock signal. A fourth control switch, such as control switch 123, is driven by an inverse of the second bit. A fourth weighted switch, such as weighted switch 151, is driven by the second clock signal. A fourth intermediate node, such as node 124, is coupled between the fourth control switch 123 and the fourth weighted switch 153. A fourth precharge transistor, such as precharge transistor 136, is coupled to said fourth intermediate node 124, wherein said fourth precharge transistor 136 is driven by an inverse of the second clock signal. The capacitor 158 is coupled to said third control switch 113, said fourth control switch 123, said third precharge transistor 132 and said fourth precharge transistor 136. In a further embodiment, the first weighted switch 141 has substantially twice a capacitance of the third weighted switch 143.

Figure 2:
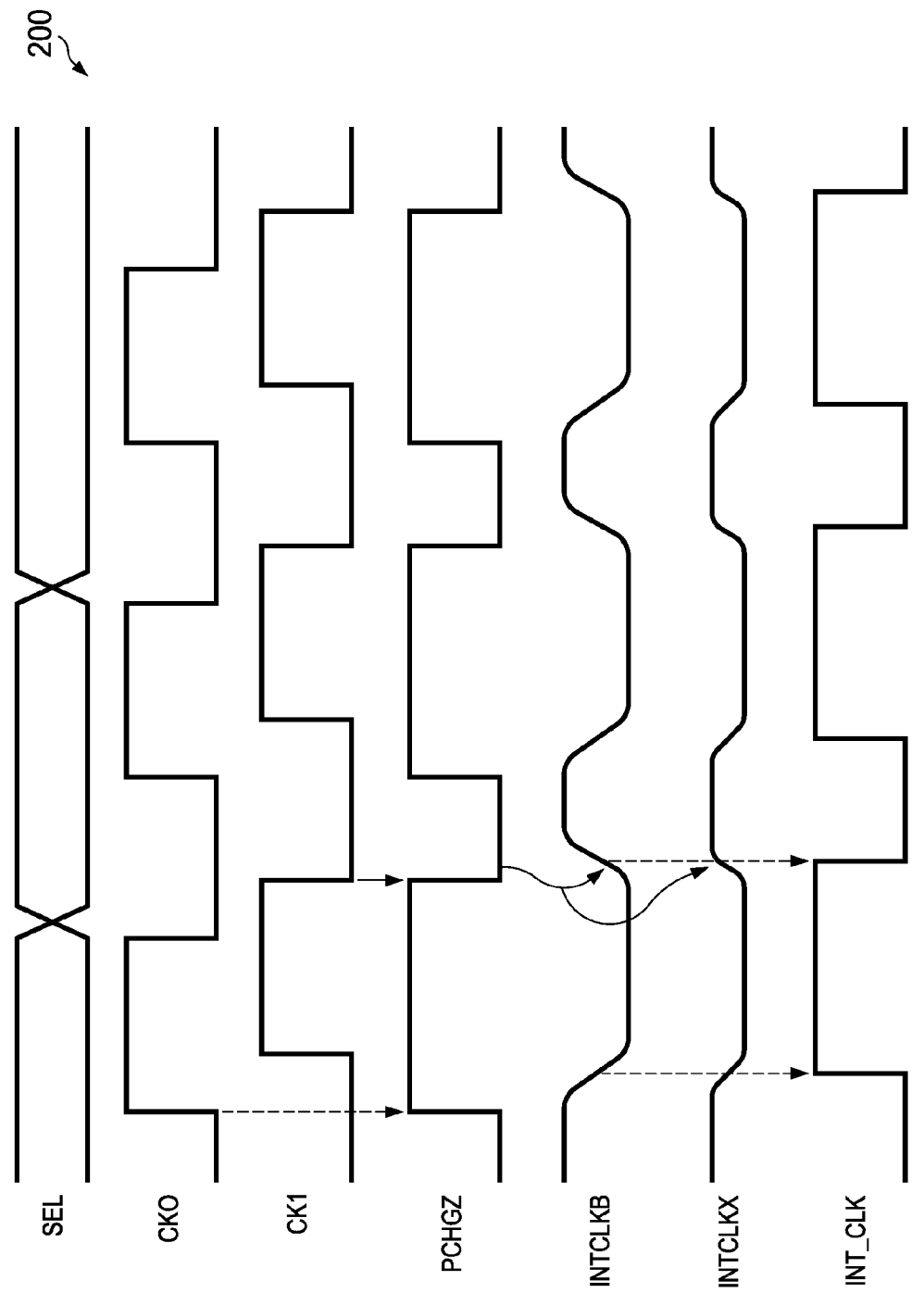
FIG. 2 is an illustration of a timing diagram of a phase blending of FIG. 1.

Turning now to FIG. 2, illustrated is one embodiment a timing diagram 200. Generally, the intermediate nodes 112-118 and intermediate nodes 122-128 are all precharged to one threshold voltage below the voltage supply 159 when the CK0Z and CK1Z clocks goes low. The intermediate nodes 112-118 and intermediate nodes 122-128 are selectively discharged to ground, depending on SEL by the high cycle of the input clocks CK0 and CK1. Precharging of the nodes 112-118 and 122-128 in this fashion has the effect that charge state of all the intermediate nodes is the same for each interpolation regardless of the control word. Therefore the memory and the history effect are erased or substantially erased.

In the timing diagram 200, a CK0 signal is applied to weighted switches 141-147 and a CK1 signal is applied to switches 151 to 157. PCHGZ is signal that is applied to pMOS precharge transistor 163. PCHGZ is a low active signal, i.e. capacitor precharge transistor 163 being a pMOS device is activated and on when PCHGZ is low. This happens when both CK0 and CK1 go low.

INTCLKB node, as is illustrated, is a voltage value that drops when both CLK1 and CLK2 are applied. This occurs because either weighted switches 141 to 147 are on, or weighted transistors 151-157 are on, according to the SEL (and SELZ) command. A negative transition at internal node 158 starts after a rising edge of CK0 and continues through a rising edge CK1, as determined by SEL command. Similarly, INTCLKB starts going high after both CK0 and CK1 falling edges.

In FIG. 2, as is illustrated, after an input clock transitions high to low, i.e. after the interpolation of the positive edge is complete, the INTCLKB node 158 is precharged to VDD through a circuit precharge transistor, such as the precharge transistor 163. The gate of the circuit precharge transistor 163 is controlled by PCHGZ. When this signal goes low after CK0_1 and CK1_1 go low, the circuit precharge transistor 163 pulls INTCLKB node 158 high, setting it up for rising edge interpolation. At the same time, internal nodes 112-128 are also precharged high to VDD-Vt (threshold voltage of the nMOS precharge transistor 131-138).

Figure 3:
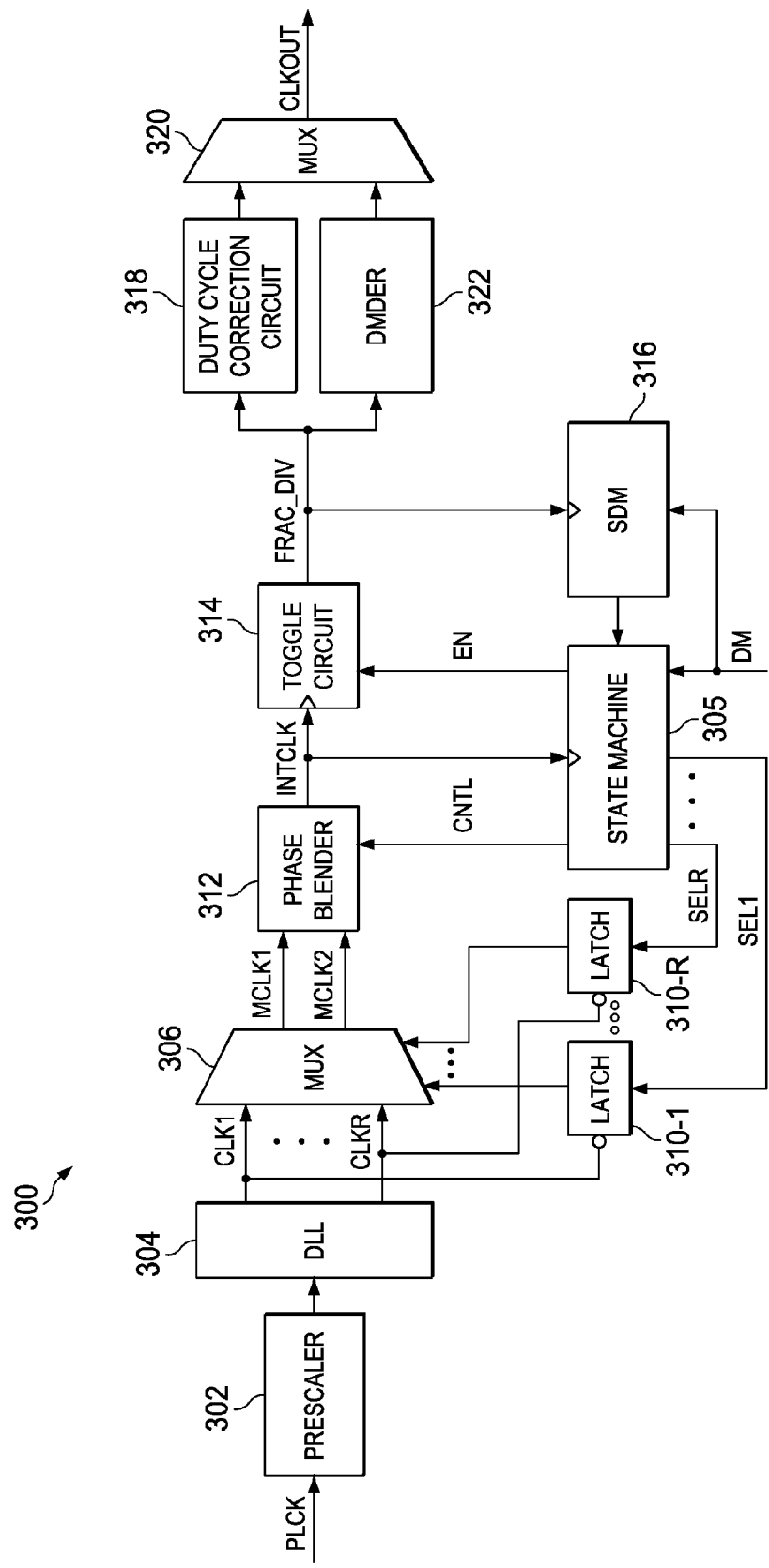
FIG. 3 is an embodiment of a digital phase interpolator that uses the phase blender circuit of FIG. 1.

Turning now to FIG. 3, an example of a fractional divider 300 can be seen that employs the phase blender 100 of FIG. 1 as a phase blender 312. The divider 300 generally comprises a prescaler 302, a delay locked loop (DLL) 304, a multiplexers or muxes 306 and 320, state machine 308, latches 310-1 to 310-R, phase blender or interpolator 312, toggle circuit 314, duty cycle correction circuit or DCC, and sigma-delta modulator or SDM 316, and divider 322.

In operation, a divider receives the clock signal PCLK from a PLL and generates a divided clock signal CLKOUT based on a control word DIV that indicates the magnitude of division. Typically, the control word DIV can, for example, be 30 bits long having 10 bits for an integer setting, 8 bits for a coarse fractional setting, and 12 bits for a fine fractional setting. Generally, the prescaler 302 divides the clock signal PCLK for use by the DLL 204 (e.g., divided by two). The DLL 304, which has several taps (i.e., 16), can generate several phases CLK1 to CLKR of the prescaled clock signal (from prescaler 302) at these taps. Each of these phases CLK1 to CLKR of the prescaled clock signal are generally provided to the input terminals of mux 306 and state machine 308. Each phase CLK1 to CLKR can also be provided to a respective latch 310-1 to 310-R (which may be configured to operate as D flip-flops or latches depending on the fractional part of the divided ratio). The state machine 308 (which can receive the integer setting and coarse fractional setting from the control word DIV) controls the mux 306 (through latches 310-1 top 310-R with the use of select signals SEL1 to SELR) so as to select consecutive phases MCLK1 and MCLK2 (which, for example, can correspond to phases CLK(i) and CLK(i+1) from phases CLK1 to CLKR that are input into mux 306.

The phase blender 312 generally generates finer intermediate phases by interpolating the consecutive phases CK0 and CK1, and the output INT_CLK of phase blender 312 can then be used as a clocking signal for toggle circuit 314 (which may be a D flip-flop) that is enabled by the state machine 208 (which can provide enable signal EN). This output signal FRAC_DIV from the toggle circuit 314 can then be provided to the DCC 318, and divider 320. Mux 320 can then select between the outputs of divider 320 (which can, for example, be a divide-by-2 divider) and the DCC 318 (which can be based on control word DIV) so as to refine the output clock signal CLKOUT. Additionally, the output signal FRAC_DIV of toggle circuit 214 can be provided to SDM 316 (which can also receive the fine fractional setting from control word DIV and which may be a first order SDM) so that the SDM 316 can provide a control signal to the state machine 208 to dither the output clock signal CLKOUT between two blended phases derived from consecutive phases CK0 and CK1 to generate the fine divide ratios and generally maintain a low deterministic jitter.

Figure 4:
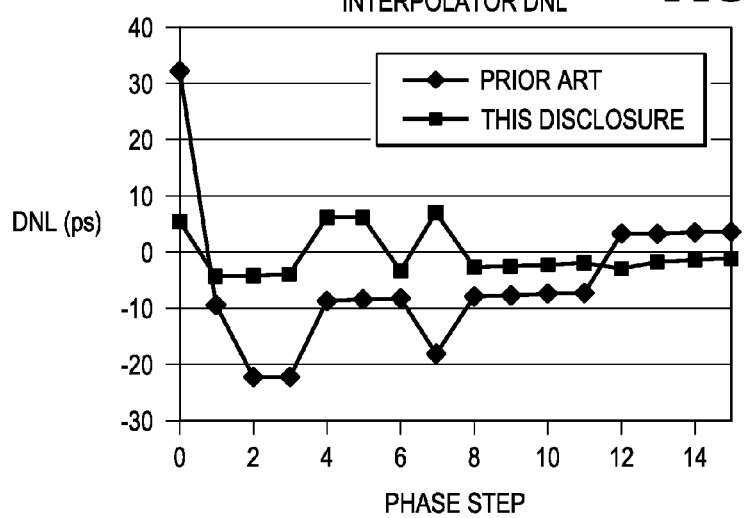
FIG. 4 is a graph of an interpolation error with and without the phase blender circuit of FIG. 1.

Turning now to FIG. 4, illustrated is one example of a reduced jitter when using the circuit 100 as a phase blender 312 when compared to prior technologies. As is illustrated, jitter noise can be reduced by a factor of, for example, 5, for the extreme cases. Differential nonlinearity (DNL) is shown in picoseconds ($=10^{-12}$ seconds). This plot is constructed from SPICE® simulation results.

Figure 5A:
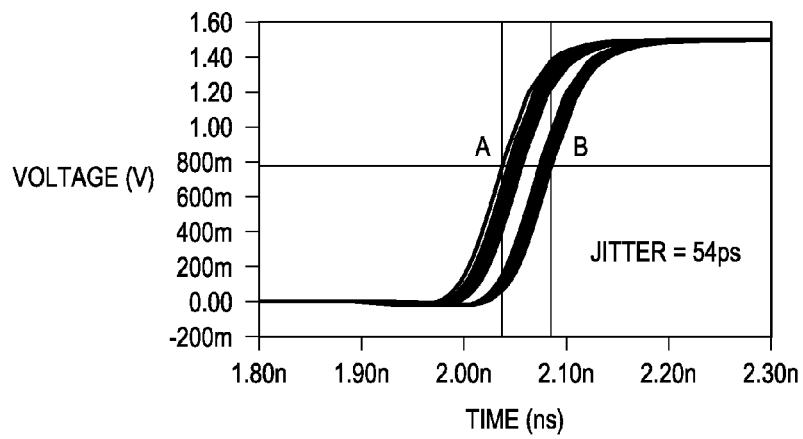
FIG. 5A is a graph of a prior art jitter of an interpolation circuit.

Turning now to FIG. 5A, illustrated is a prior art description of jitter. This figure shows an eye diagram where multiple periods of the output clock are folded back on top of each other. For an ideal output, all the edges would lie on top of each other. In a practical case, there is a broadening of the folded back edge due to non-idealities in timing. This is an indication of the timing jitter associated with this signal. As such, having a lower broadening of the folded back edges is desirable, i.e. lower jitter.

FIG. 5A shows the eye diagram and associated jitter with it for the fractional divider output using the previous implementation of the phase interpolator. To show the impact of the phase interpolator on jitter, an ideal DLL (Delay Locked Loop) is used in this simulation. Therefore, the entire jitter is due to the phase interpolator non-linearity.

Figure 5B:
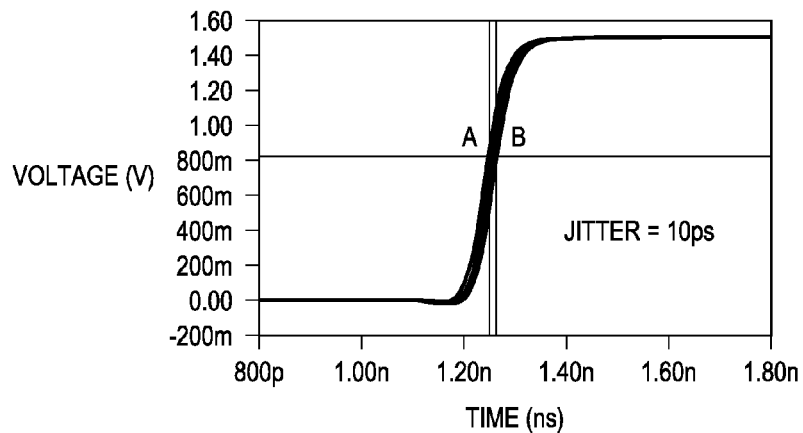
FIG. 5B is a graph of jitter of an interpolation circuit that employs the phase blender circuit of FIG. 1.

FIG. 5B shows the corresponding eye diagram and resulting jitter when using the phase interpolator described in FIG. 1. As can be seen, the phase interpolator described in this application results in a significant reduction in the output jitter of the fractional divider due to the much improved linearity. This plot is constructed from SPICE® simulation results.

Those skilled in the art to which this application relates will appreciate that other and further additions, deletions, substitutions and modifications may be made to the described embodiments.

What is claimed is:

1. An apparatus comprising:
a control switch driven by a bit value;
a weighted switch driven by a clock signal;
an intermediate node coupled between said control switch and said weighted switch; and
a precharge transistor coupled to said intermediate node, wherein said precharge transistor is driven by an inverse of said clock signal.

2. The apparatus of claim 1, wherein said control switch and said weighted switch are coupled to a capacitor.

3. The apparatus of claim 1, further comprising a capacitor precharge transistor coupled to said capacitor that can precharge said capacitor.

4. The apparatus of claim 1, further comprising wherein said precharge transistor is transitioned on when said control switch and said weighted switch are driven off.

5. The apparatus of claim 1, further comprising:
a second control switch driven by an inverse of said bit value;
a second weighted switch driven by a second clock signal;
a second intermediate node coupled between said second control switch and said second weighted switch; and
a second precharge transistor coupled to said intermediate node, wherein said precharge transistor is driven by an inverse of said second clock signal,
wherein said first weighted switch has substantially a same capacitance as said second weighted switch.

6. The apparatus of claim 1, wherein said capacitor is coupled to an inverter to generate a blended phase output of the first clock signal and the second clock signal.

7. The apparatus of claim 1, wherein said bit value is part of a control word.

8. An apparatus, comprising:
a first control switch driven by a first bit value;
a first weighted switch driven by a first clock signal;
a first intermediate node coupled between said first control switch and said second weighted switch;
a first precharge transistor coupled to said first intermediate node, wherein said precharge transistor is driven by an inverse of said first clock signal;
a second control switch driven by a second bit value;
a second weighted switch driven by a second clock signal;
a second intermediate node coupled between said second control switch and said second weighted switch;
a second precharge transistor coupled to said second intermediate node, wherein said second precharge transistor is driven by an inverse of said second clock signal; and
a capacitor coupled to said first control switch, said second control switch, said first precharge transistor and said second precharge transistor.

9. The apparatus of claim 8, further comprising a capacitor precharge transistor coupled to said capacitor that can precharge said capacitor.

10. The apparatus of claim 8, further comprising wherein said precharge transistor is transitioned upon said control switch and said weighted switch are driven off.

11. The apparatus of claim 8, wherein said capacitor is coupled to an inverter to generate a blended phase output of the first clock signal and the second clock signal.

12. The apparatus of claim 8, wherein said first bit value is part of a control word.

13. The apparatus of claim 8, further comprising:
a third control switch driven by a third bit value;
a third weighted switch driven by the first clock signal;
a third intermediate node coupled between said third control switch and said fourth weighted switch;
a third precharge transistor coupled to said third intermediate node, wherein said precharge transistor is driven by an inverse of the first clock signal;
a fourth control switch driven by an inverse of said bit of said logical unit;
a fourth weighted switch driven by the second clock signal;
a fourth intermediate node coupled between said fourth control switch and said fourth weighted switch;
a fourth precharge transistor coupled to said fourth intermediate node, wherein said fourth precharge transistor is driven by an inverse of said second clock signal; and
said capacitor coupled to said third control switch, said fourth control switch, said third precharge transistor and said fourth precharge transistor,
and wherein said first weighted switch has substantially twice a capacitance of said third weighted switch.

14. A system, comprising:
a delay locked loop (DLL) having a plurality of taps;
a phase blender that is coupled to receive signals from consecutive taps of the DLL, the phase blender including:
a control switch driven by a bit value;
a weighted switch driven by a clock signal;
an intermediate node coupled between said control switch and said weighted switch; and
a precharge transistor coupled to said intermediate node, wherein said precharge transistor is driven by an inverse of said clock signal,
a state machine that is coupled to the phase blender so as to provide control word to the phase blender;
a toggle circuit that is coupled to the phase blender and the state machine;
a duty cycle correction circuit that is coupled to the toggle circuit; and
a sigma delta modulator that is coupled to the toggle circuit and state machine.

15. The system of claim 14, wherein said control switch and said weighted switch are coupled to a capacitor.

16. The system of claim 14, further comprising a capacitor precharge transistor coupled to said capacitor that can precharge said capacitor.

17. The system of claim 14, further comprising wherein said precharge transistor is transitioned on when said control switch and said weighted switch are driven off.

18. The system of claim 14, said phase blender further comprising:
- a second control switch driven by a second bit value;
- a second weighted switch driven by a second clock signal;
- a second intermediate node coupled between said second control switch and said second weighted switch; and
- a second precharge transistor coupled to said intermediate node, wherein said precharge transistor is driven by an inverse of said second clock signal,
- wherein said first weighted switch has substantially a same capacitance as said second weighted switch.

19. The system of claim 14, wherein said capacitor is coupled to an inverter to generate a blended phase output of the first clock signal and the second clock signal.

20. The system of claim 14, wherein the bit value is part of a control word.

* * * * *